United States Patent
Nakayama

[19]
[11] Patent Number: 5,907,164
[45] Date of Patent: May 25, 1999

[54] INALAS/INGAAS HETEROJUNCTION FIELD EFFECT TYPE SEMICONDUCTOR DEVICE

[75] Inventor: Tatsuo Nakayama, Tokyo, Japan

[73] Assignee: NEC Corporation, Tokyo, Japan

[21] Appl. No.: 08/767,372

[22] Filed: Dec. 16, 1996

[30] Foreign Application Priority Data

Dec. 19, 1995 [JP] Japan ................................. 7-330221

[51] Int. Cl.$^6$ ................. H01L 31/0328; H01L 31/0336
[52] U.S. Cl. ............................................ 257/192; 257/194
[58] Field of Search ................................ 257/15, 20, 22, 257/24, 27, 192, 194

[56] References Cited

U.S. PATENT DOCUMENTS

| | | | |
|---|---|---|---|
| 5,206,528 | 4/1993 | Nashimoto | 257/192 |
| 5,268,582 | 12/1993 | Kopf et al. | 257/21 |
| 5,420,442 | 5/1995 | Hasenberg et al. | 257/20 |

FOREIGN PATENT DOCUMENTS

| | | |
|---|---|---|
| 0569259 | 11/1993 | European Pat. Off. . |
| 63-311772 | 12/1988 | Japan . |
| 4085939 | 3/1992 | Japan . |
| 7142513 | 6/1995 | Japan . |

OTHER PUBLICATIONS

Fujihara et al; Thermally stable InAlAs/InGaAs heterojunction FET with AlAs/InAs superlattice insertion layer, May 23, 1996.

"Photoreflectance Characterization of an InAlAs/InGaAs Heterostructure Bipolar Transistor" Chen, Y.H. Proceedings of Taipei Technical College, vol. 27, No. 2, p. 1; Jul. 1994.

"Photoreflectance Characterization of InAlAs/InGaAs Hetero Junction Bipolar Transistor with a 300.ANG. Spacer" Chen, Y.H. Proceedings of Taipei Technical School, vol. 27, No. 1, p. 33, Mar. 1995.

Fujihara et al; "Thermally stable InAlAs/InGaAs heterojunction FET with AlAs/InAs superlattice insertion layer"; pp. 1039–1041; Electronic Letters, vol. 32, No. 11, May 23, 1996.

N. Hayafuji et al., "Thermal Stability of AlInAs/GaInAs/InP heterostructures", Appl Phys. Lett. 66(7), pp. 863–865, Feb. 1995.

A. Fujihara et al., "Thermal Stability of InAlAs/InGaAs HJFETs with an In $(Al_{1-x} Ga_x)$As Layer", Technical Report of IEICE, pp. 13–20, Oct. 1995.

*Primary Examiner*—Wael M. Fahmy
*Attorney, Agent, or Firm*—Hayes Soloway Hennessey, Grossman & Hage, P.C.

[57] ABSTRACT

In an InAlAs/InGaAs heterojunction field type semiconductor device including an InP substrate, a superlattice layer formed by periods of InAs/AlAs or InAs/AlGaAs is formed over an InGaAs channel layer which is formed over the InP substrate.

28 Claims, 5 Drawing Sheets

INALAS/INGAAS HETEROJUNCTION FIELD EFFECT TYPE SEMICONDUCTOR DEVICE

BACKGROUND OF THE INVENTION

1. Field of the Invention

The present invention relates to a semiconductor device, and more particularly, to an InAlAs/InGaAs heterojunction field effect type semiconductor device formed on an InP substrate.

2. Description of the Related Art

A prior art heterojunction field effect type semiconductor device is constructed by an InP substrate, an InAlAs/InGaAs heterostructure formed on the InP substrate, an InAlAs Schottky layer formed on the heterojunction, and electrodes formed on the InAlAs Schottky layer. These layers are sequentially epitaxially grown. This will be explained later in detail.

The fabrication of the device, however, generally requires some thermal treatments after growth, so that the electrical quality are degraded. That is, during the thermal treatments, impurity atoms adhered to the surface of epitaxial layers are thermally diffused thereinto, to thereby deteriorate the crystalline quality of the epitaxial layers (see: N. Hayafuji et al., "Thermal Stability of AlInAs/GaInAs/InP Heterostructures", Appl Phys. Lett. 66 (7), pp. 863–865, February 1995).

SUMMARY OF THE INVENTION

It is an object of the present invention to provide an InAlAs/InGaAs heterojunction field effect type semiconductor device which can suppress the degradation of he crystalline quality due to the thermal treatments.

According to the present invention, in an InAlAs/InGaAs heterojunction field effect type semiconductor device including an InP substrate, a superlattice layer formed by periods of InAs/AlAs or InAs/AlGaAs is formed over an InGaAs channel layer which is formed over the InP substrate. The superlattice layer suppresses the diffusion of impurity atoms adhered to the surface of the device into the interior thereof.

BRIEF DESCRIPTION OF THE DRAWINGS

The present invention will be more clearly understood from the description as set forth below, with reference to the accompanying drawings, wherein.

DESCRIPTION OF THE PREFERRED EMBODIMENTS

Before the description of the preferred embodiments, a prior art InAlAs/InGaAs heterojunction field effect type semiconductor device (transistor) will be explained with reference to FIG. 1.

Figure 1:
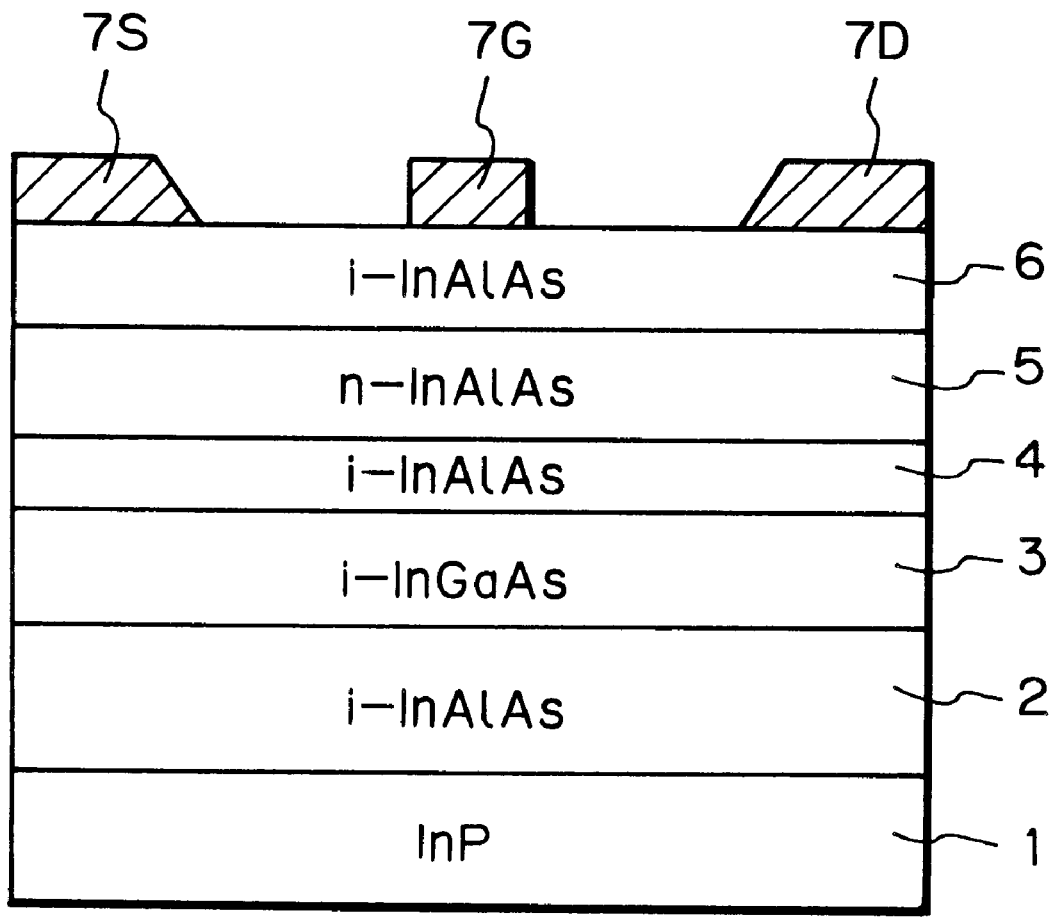
FIG. 1 is a cross-sectional view illustrating a prior art InAlAs/InGaAs heterojunction field effect type semiconductor device.

In FIG. 1, reference numeral 1 designates an InP substrate. Also, an undoped InAlAs buffer layer 2, an undoped InGaAs channel layer 3, an undoped InAlAs spacer layer 4, an N-type InAlAs electron supply layer 5 and an undoped InAlAs Schottky layer 6 are sequentially epitaxially grown on the InP substrate 1. Then, a source electrode 7S, a drain electrode 7D and a gate electrode 7G are formed on the InAlAs Schottky layer 6.

The fabrication of the device of FIG. 1, however, generally requires some thermal treatments after growth, so that the electrical quality are degraded. That is, during the thermal treatments, impurity atoms adhered to the surface of epitaxial layers are thermally diffused thereinto, thereby deteriorating the crystalline quality of the epitaxial layers (see: N. Hayafuji et al., "Thermal Stability of AlInAs/GaInAs/InP Heterostructures" Appl Phys, Lett. 66 (7), pp. 863–865, February 1995).

The deterioration of the epitaxial layers can be suppressed by introducing an InAlGaAs layer into the InAlAs Schottky layer, i.e., by forming an InAlGaAs layer on the InAlAs electron supply layer 5, to thereby reduce the Al composition ratio of the epitaxial layers on the InAlAs electron supply layer 5 (see: A. Fujihara et al., "Thermal Stability of InAlAs/InGaAs HJFETs with an In $(Al_{1-x}Ga_x)$ As layer"; Technical Report of IEICE, pp. 13–20, October 1995). In this case, however, since the improvement of thermal stability is in a trade-off relationship with the increase of a leakage current and the reduction of a gate breakdown voltage, it is substantially difficult to simultaneously achieve thermal stability while preventing increased gate current and reduced breakdown voltage.

Also, the deterioration of the epitaxial layers can be suppressed by forming an InGaAs layer on the InAlAs electron supply layer 5. In this case, however, although the InGaAs layer lattice-matches the InP substrate 1, since the InGaAs layer has a smaller bandgap than the InAlAs layers lattice-matching the InP substrate 1, the leakage current is increased and the gate breakdown voltage is reduced.

Further, the deterioration of the epitaxial layers can be suppressed by forming a GaAs layer or an AlAs layer on the InAlAs electron supply layer 5. In this case, however, since the GaAs layer or the AlAs layer lattice-mismatches the InP substrate 1 more than 3 percent thus increasing the strain energy, the crystalline quality of the epitaxial layers are also deteriorated if the thickness of the GaAs layer or the AlAs layer is increased.

Figure 2:
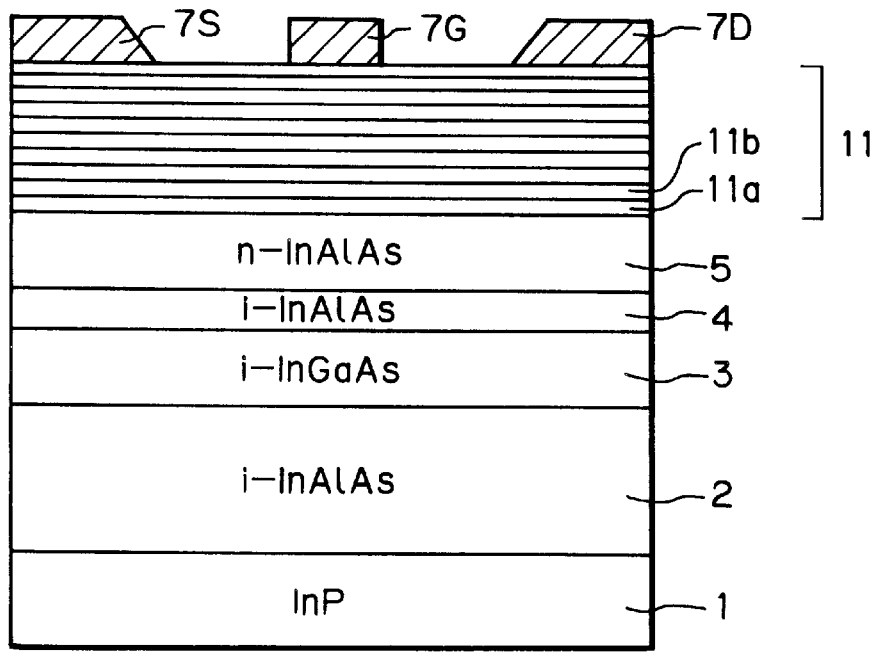
FIGS. 2, 3, 4, 5, 6, 7, 8 and 9 are cross-sectional views illustrating first, second, third, fourth, fifth, sixth, seventh and eighth embodiments, respectively, of the InAlAs/InGaAs heterojunction field effect type semiconductor device according to the present invention.

In FIG. 2, which illustrates a first embodiment of the present invention, a superlattice layer 11 is provided instead of the InAlAs Schottky layer 6 of FIG. 1. In this case, the buffer layer 2 is made of about 200 nm thick $In_{0.52}Al_{0.48}As$, the channel layer 3 is made of about 13 nm thick $In_{0.53}Ga_{0.47}As$, the spacer layer 4 is made of about 3 nm thick $In_{0.52}Al_{0.48}As$, and the electron supply layer 5 is made of about 10 nm thick $In_{0.52}Al_{0.48}As$ doped by about $5\times10^{18}$ silicon atoms/cm$^3$.

The superlattice layer 11 consists of 15 periods of one two-molecules-thick InAs layer 11a and one three-molecules-thick AlAs layer 11b.

In FIG. 2, since the superlattice layer 11 suppresses the diffusion of impurity atoms adhered to the surface of the device into the interior thereof, the deterioration of crystalline quality can be suppressed. That is, the electron transfer characteristics are hardly deteriorated. Also, since the composition ratio of InAs in the superlattice layer 11 is 0.4 (=2/5), the leakage current is never increased as compared with $In_{0.52}Al_{0.48}As$. Further, the gate breakdown voltage is hardly reduced.

Also, in FIG. 2, the thickness of the InAs layer 11a and the thickness of the AlAs layer 11b can be arbitrarily changed; however, each thickness should be less than 4 nm, preferably, 2 nm, in view of the strain energy. If such thickness is too large, the strain energy of each layer becomes too large, which deteriorates the crystalline quality.

Further, in FIG. 2, the number of periods of the superlattice layer 11 can be changed. In this case, however, if the thickness ratio of the InAs layer 11a to the AlAs layer 11b is less than 0.5 or more than 2, the average lattice constant of the superlattice layer 11 is greatly deviated from the lattice constant of the InP substrate 1, thus increasing the strain energy. Also, if the thickness ratio of the InAs layer 11a to the AlAs layer 11b is far away from 1, the strain energy increases with the increase of the thickness of the superlattice layer 11. Therefore, the thickness ratio of the InAs layer 11a to the AlAs layer 11b is preferably within approximately 0.5 to 2, and the thickness of the superlattice layer 11 is preferably smaller than approximately 25 nm.

Figure 3:
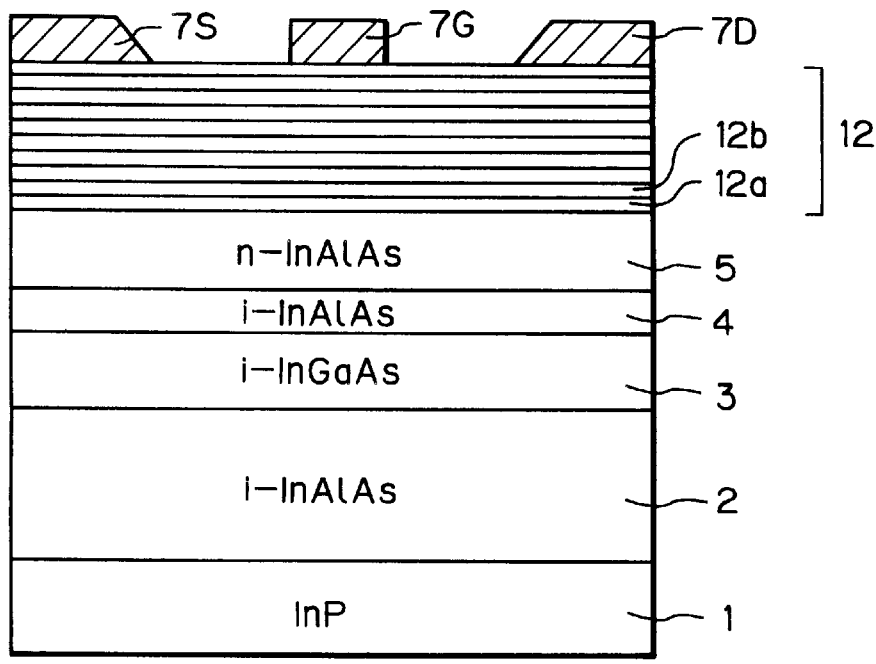

In FIG. 3, which illustrates a second embodiment of the present invention, a superlattice layer 12 is provided instead of the superlattice layer 11 of FIG. 2. The superlattice layer 12 consists of 20 periods of one two-molecules-thick InAs layer 12a and one two-molecules-thick AlAs layer 12b.

In FIG. 3, since the superlattice layer 12 suppresses the diffusion of impurity atoms adhered to the surface of the device into the interior thereof, the deterioration of crystalline quality can be suppressed. That is, the electron transfer characteristics are hardly deteriorated. Also, since the composition ratio of InAs in the superlattice layer 12 is 0.5 (=2/4), the leakage current is never increased as compared with $In_{0.52}Al_{0.48}As$. Further, the gate breakdown voltage is hardly reduced.

Also, in FIG. 3, the thickness of the InAs layer 12a and the thickness of the AlAs layer 12b can be arbitrarily changed; however, each thickness should be less than 4 nm, preferably, 2 nm, in view of the strain energy. As a result, the average lattice constant of the superlattice layer 12 is within ±0.5 percent from the lattice constant of the InP substrate 1, so that the strain energy of each layer becomes small, which suppresses the deterioration of the crystalline quality.

Figure 4:
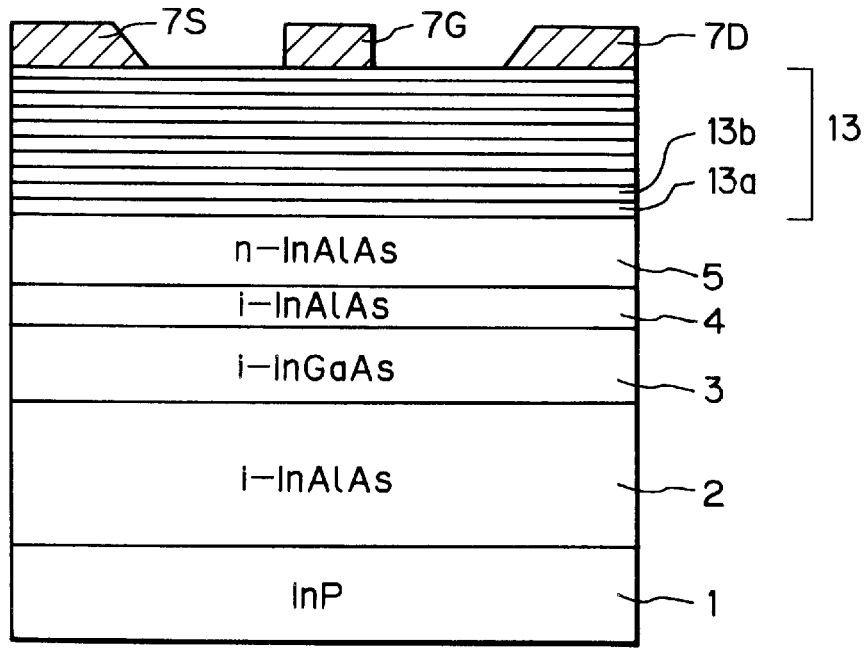

Further, in FIG. 3, the number of periods of the superlattice layer 12 can be changed. In FIG. 4, which illustrates a third embodiment of the present invention, a superlattice layer 13 is provided instead of the superlattice layer 11 of FIG. 2. The superlattice layer 13 consists of 15 periods of one two-molecules-thick InAs layer 13a and one three-molecules-thick AlGaAs layer 13b.

In FIG. 4, since the superlattice layer 13 suppresses the diffusion of impurity atoms adhered to the surface of the device into the interior thereof, the deterioration of crystalline quality can be suppressed. That is, the electron transfer characteristics are hardly deteriorated. Also, since the composition ratio of InAs in the superlattice layer 13 is 0.4 (=2/5), the leakage current is never increased as compared with $In_{0.52}Al_{0.48}As$. Further, the gate breakdown voltage is hardly reduced.

Also, in FIG. 4, the thickness of the InAs layer 13a and the thickness of the AlGaAs layer 13b can be arbitrarily changed; however, each thickness should be less than 4 nm, preferably, 2 nm, in view of the strain energy. If such thickness is too large, the strain energy of each layer becomes too large, which deteriorates the crystalline quality.

Further, in FIG. 4, the number of periods of the superlattice layer 13 can be changed. In this case, however, if the thickness ratio of the InAs layer 13a to the AlGaAs layer 13b is less than 0.5 or more than 2, the average lattice constant of the superlattice 13 is greatly deviated from the lattice constant of the InP substrate 1, thus increasing the strain energy. Also, if the thickness ratio of the InAs layer 13a to the AlGaAs layer 13b is far away from 1, the strain energy increases with the increase of the thickness of the superlattice layer 13. Therefore, the thickness ratio of the InAs layer 13a to the AlGaAs layer 13b is preferably within approximately 0.5 to 2, and the thickness of the superlattice layer 13 is preferably smaller than approximately 25 nm.

Figure 5:
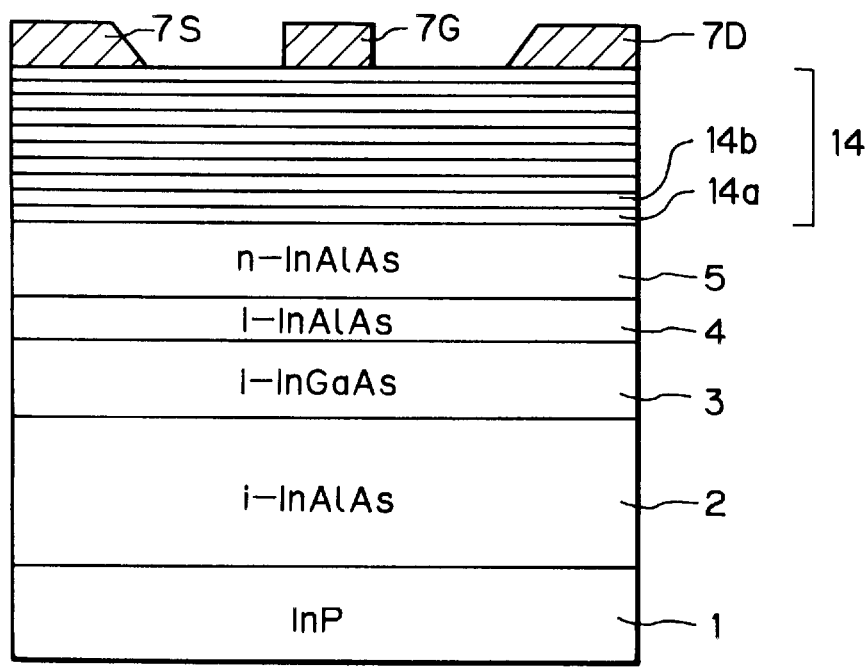

In FIG. 5, which illustrates a fourth embodiment of the present invention, a superlattice layer 14 is provided instead of the superlattice layer 13 of FIG. 4. The superlattice layer 14 consists of 20 periods of one two-molecules-thick InAs layer 14a and one two-molecules-thick AlGaAs layer 14b.

In FIG. 5, since the superlattice layer 14 suppresses the diffusion of impurity atoms adhered to the surface of the device into the interior thereof, the deterioration of crystalline quality can be suppressed. That is, the electron transfer characteristics are hardly deteriorated. Also, since the composition ratio of InAs in the superlattice layer 14 is 0.5 (=2/4), the leakage current is never increased as compared with $In_{0.52}Al_{0.48}As$. Further, the gate breakdown voltage is hardly reduced.

Also, in FIG. 5, the thickness of the InAs layer 14a and the thickness of the AlGaAs layer 14b can be arbitrarily changed; however, each thickness should be less than 4 nm, preferably, 2 nm, in view of the strain energy. As a result, the average lattice constant of the superlattice layer 14 is within ±0.5 percent from the lattice constant of the InP substrate 1, so that the strain energy of each layer becomes small, which suppresses the deterioration of the crystalline quality.

Further, in FIG. 5, the number of periods of the superlattice layer 14 can be changed.

Figure 6:
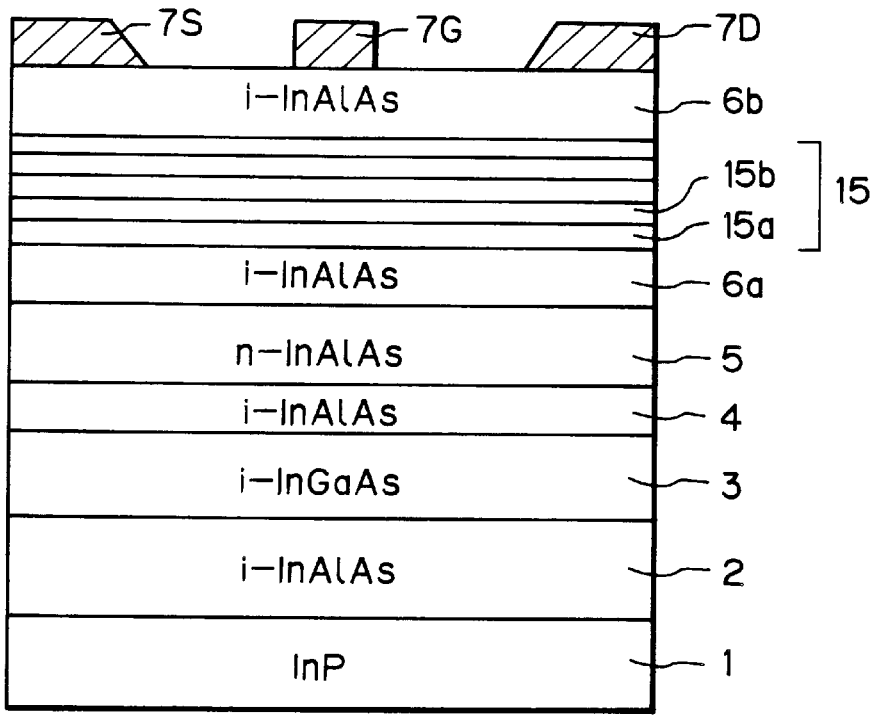

In FIG. 6, which illustrates a fifth embodiment of the present invention, a superlattice layer 15 is interposed into the InAlAs Schottky layer 6 of FIG. 1. In this case, the InAlAs Schottky layer 6 is divided into an about 6 nm thick $In_{0.52}Al_{0.48}As$ layer 6a and an about 5 nm thick $In_{0.52}Al_{0.48}As$ layer 6b. The superlattice layer 15 consists of 5 periods of one two-molecules-thick InAs layer 15a and one four-molecules-thick AlAs layer 15b.

In FIG. 6, since the superlattice layer 15 suppresses the diffusion of impurity atoms adhered to the surface of the device into the interior thereof, the deterioration of crystalline quality can be suppressed. That is, the electron transfer characteristics are hardly deteriorated. Also, since the composition ratio of InAs in the superlattice layer 15 is 0.33 (=2/6), the leakage current is never increased as compared with $In_{0.52}Al_{0.48}As$. Further, the gate breakdown voltage is hardly reduced.

Also, in FIG. 6, the thickness of the InAs layer 15a and the thickness of the AlAs layer 15b can be arbitrarily changed; however, each thickness should be less than 4 nm, preferably, 2 nm, in view of the strain energy. If such thickness is too large the strain energy of each layer becomes too large, which deteriorates the crystalline quality.

Further, in FIG. 6, the number of periods of the superlattice layer 15 can be changed. In this case, however, if the thickness ratio of the InAs layer 15a to the AlAs layer 15b is less than 0.5 or more than 2, the average lattice constant of the superlattice 15 is greatly deviated from the lattice constant of the InP substrate 1, thus increasing the strain energy. Also, if the thickness ratio of the InAs layer 15a to the AlAs layer 15b is far away from 1, the strain energy increases with the increases of the thickness of the superlattice layer 15. Therefore, the thickness ratio of the InAs layer 15a to the AlAs layer 15b is preferably within approximately 0.5 to 2, and the thickness of the superlattice layer 15 is preferably smaller than approximately 25 nm.

Figure 7:
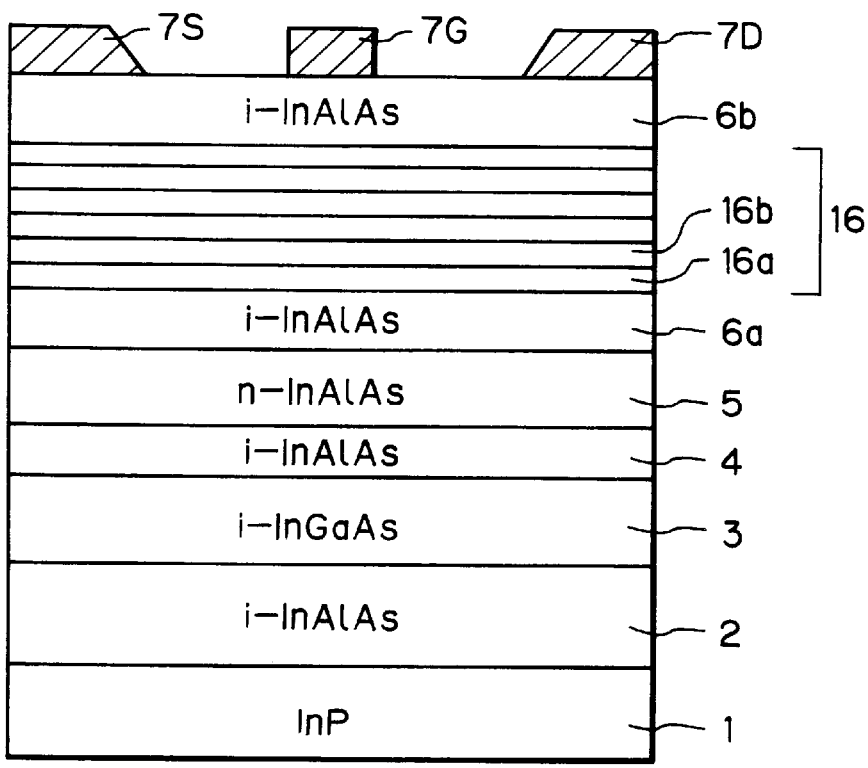

In FIG. 7, which illustrates a sixth embodiment of the present invention, a superlattice layer 16 is provided instead of the superlattice layer 15 of FIG. 6. The superlattice layer 16 consists of 6 periods of one two-molecules-thick InAs layer 16a and one two-molecules-thick AlAs layer 16b.

In FIG. 7, since the superlattice layer 16 suppresses the diffusion of impurity atoms adhered to the surface of the device into the interior thereof, the deterioration of crystalline quality can be suppressed. That is, the electron transfer characteristics are hardly deteriorated. Also, since the composition ratio of InAs in the superlattice layer 12 is 0.5 (=2/4), the leakage current is never increased as compared with $In_{0.52}Al_{0.48}As$. Further, the gate breakdown voltage is hardly reduced.

Also, in FIG. 7, the thickness of the InAs layer 16a and the thickness of the AlAs layer 16b can be arbitrarily changed; however, each thickness should be less than 4 nm, preferably, 2 nm, in view of the strain energy. As a result, the average lattice constant of the superlattice layer 16 is within ±0.5 percent from the lattice constant of the InP substrate 1, so that the strain energy of each layer becomes small, which suppresses the deterioration of the crystalline quality.

Further, in FIG. 7, the number of periods of the superlattice layer 16 can be changed.

Figure 8:
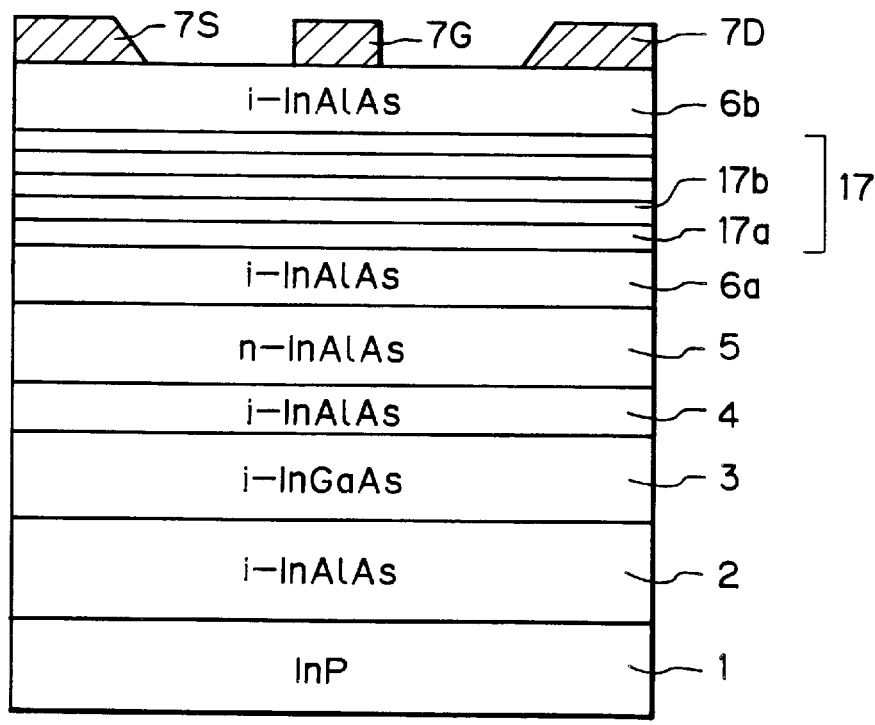

In FIG. 8, which illustrates a seventh embodiment of the present invention, a superlattice layer 17 is provided instead of the superlattice layer 15 of FIG. 6. The superlattice layer 17 consists of 5 periods of one two-molecules-thick InAs layer 17a and one four-molecules-thick AlGaAs layer 17b.

In FIG. 8, since the superlattice layer 17 suppresses the diffusion of impurity atoms adhered to the surface of the device into the interior thereof, the deterioration of crystalline quality can be suppressed. That is, the electron transfer characteristics are hardly deteriorated. Also, since the composition ratio of InAs in the superlattice layer 17 is 0.33 (=2/6), the leakage current is never increased as compared with $In_{0.52}Al_{0.48}As$. Further, the gate breakdown voltage is hardly reduced.

Also, in FIG. 8, the thickness of the InAs layer 17a and the thickness of the AlGaAs layer 17b can be arbitrarily changed; however, each thickness should be less than 4 nm, preferably, 2 nm, in view of the strain energy. If such thickness is too large, the strain energy of each layer becomes too large, which deteriorates the crystalline quality.

Further, in FIG. 8, the number of periods of the superlattice layer 17 can be changed. In this case, however, if the thickness ratio of the InAs layer 17a to the AlGaAs layer 17b is less than 0.5 or more than 2, the average lattice constant of the superlattice 17 is greatly deviated from the lattice constant of the InP substrate 1, thus increasing the strain energy. Also, if the thickness ratio of the InAs layer 17a to the AlGaAs layer 17b is far away from 1, the strain energy increases with the increases of the superlattice layer 17. Therefore, the thickness ratio of the InAs layer 17a to the AlGaAs layer 17b is preferably within approximate 0.5 to 2, and the thickness of the superlattice layer 17 is preferably smaller than approximately 25 nm.

Figure 9:
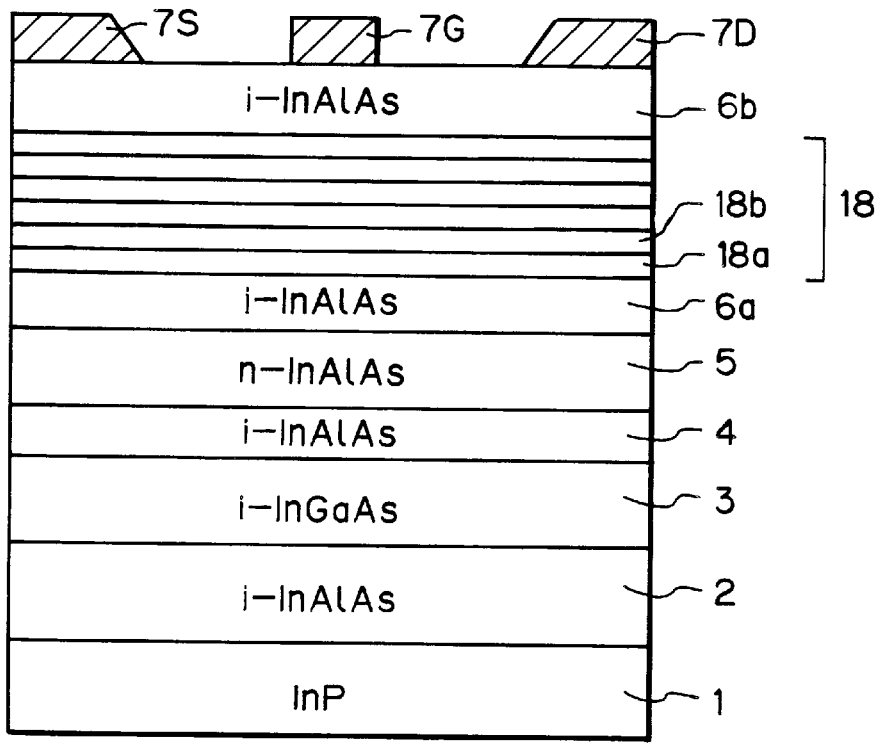

In FIG. 9, which illustrates an eighth embodiment of the present invention, a superlattice layer 18 is provided instead of the superlattice layer 17 of FIG. 8. The superlattice layer 18 consists of 6 periods of one two-molecules-thick InAs layer 18a and one two-molecules-thick AlGaAs layer 18b.

In FIG. 9, since the superlattice layer 18 suppresses the diffusion of impurity atoms adhered to the surface of the device into the interior thereof, the deterioration of crystalline quality can be suppressed. That is, the electron transfer characteristics are hardly deteriorated. Also, since the composition ratio of InAs in the superlattice layer 18 is 0.5 (=2/4), the leakage current is never increased as compared with $In_{0.5}Al_{0.48}As$. Further, the gate breakdown voltage is hardly reduced.

Also, in FIG. 9, the thickness of the InAs layer 18a and the thickness of the AlGaAs layer 18b can be arbitrarily changed; however, each thickness should be less than 4 nm, preferably, 2 nm, in view of the strain energy. As a result, the average lattice constant of the superlattice layer 18 is within ±0.5 percent from the lattice constant of the InP substrate 1, so that the strain energy of each layer becomes small, which suppresses the deterioration of the crystalline quality.

Further, in FIG. 9, the number of periods of the superlattice layer 18 can be changed.

In FIGS. 2 to 9, although the channel layer 3 is made of $In_{0.53}Ga_{0.47}As$, the channel layer 3 can be made of $In_xGa_{1-x}As$ (0.53<x<1.0). Also, the channel layer 3 can be thicker than 10 nm. In this case, if x>0.8, the $In_xGa_{1-x}As$ channel layer 3 increases the strain energy. Therefore, if the thickness of the channel layer 3 is t nm, a multi-layer formed by a 10 nm thick $In_xGa_{1-x}As$ (0<x<0.8) and a (10-t) nm thick $In_yG_{1-y}As$ ($y \geq 0.8$).

Also, in FIGS. 2 to 9, the thickness of the buffer layer 2 and the thickness of the spacer layer 4 can be changed. In addition, the buffer layer 2 and the spacer layer 4 can be made of other materials such as GaAs, AlAs, InP, AlSb, GaSb, GaP, AlP or InAS.

Further, in FIGS. 2 to 9, the impurity concentration of Si in the electron supply layer 5 can be changed. In addition, other N-type dopants such as S or Se can be used instead of Si. Further, P-type dopants such as Be or C can be introduced into the layer 5; in this case, the layer 5 constitutes a hole supply layer.

Still further, in FIGS. 2 to 9, the InAlAs Schottky layers 6a and 6b can be of a conduction type opposite to the charge supply layer 5. For example, if the charge supply layer 5 is of an N-type, the Schottky layers 6a and 6b can be of a P-type.

As explained hereinabove, according to the present invention, since the superlattice layer formed by periods of InAs/AlAs or InAs/AlGaAs suppresses the diffusion of impurity atoms into epitaxial layers of the device, the deterioration of crystalline quality can be suppressed to suppress the deterioration of electron transfer characteristics.

I claim:

1. A heterojunction field effect type semiconductor device comprising:
   an InP substrate;
   an InGaAs channel layer formed over said InP substrate;
   a superlattice layer formed by periods of InAs/AlAs and over said InGaAs channel layer;
   a first InAlAs layer formed beneath said superlattice layer; and
   a second InAlAs layer formed on said superlattice layer.

2. The device as set forth in claim 1, further comprising an InAlAs charge supply layer formed between said InGaAs channel layer and said superlattice layer.

3. The device as set forth in claim 2, wherein said superlattice layer is thinner than approximately 25 nm.

4. The device as set forth in claim 1, wherein the ratio of average lattice constant of said superlattice layer to lattice constant of said InP substrate is approximately 0.995 to 1.005.

5. The device as set forth in claim 1, wherein each of said InAs and said AlAs of said superlattice layer is thinner than approximately 4 nm.

6. The device as set forth in claim 1, wherein the thickness ratio of said InAs and said AlAs of said superlattice layer is approximately 0.5 to 2.

7. A heterojunction field effect type semiconductor device comprising:
an InP substrate;
an InGaAs channel layer formed over said InP substrate; and
a superlattice layer formed by periods of InAs/AlGaAs and over said InGaAs channel layer;
a first InAlAs layer formed beneath said superlattice layer; and
a second InAlAs layer formed on said superlattice layer.

8. The device as set forth in claim 7, further comprising an InAlAs charge supply layer formed between said InGaAs channel layer and said superlattice layer.

9. The device as set forth in claim 8, wherein said superlattice layer is thinner than approximately 25 nm.

10. The device as set forth in claim 7, wherein the ratio of average lattice constant of said superlattice layer to lattice constant of said InP substrate is approximately 0.995 to 1.005.

11. The device as set forth in claim 7, wherein each of said InAs and said AlGaAs of said superlattice layer is thinner than approximately 4 nm.

12. The device as set forth in claim 7, wherein thickness ratio of said InAs and said AlGaAs of said superlattice layer is approximately 0.5 to 2.

13. A heterojunction field effect type semiconductor device comprising:
an InP substrate;
an undoped InAlAs buffer layer formed on said InP substrate;
an undoped InGaAs channel layer formed on said InAlAs buffer layer;
an undoped InAlAs spacer layer formed on said InGaAs channel layer;
a doped InAlAs carrier supply layer formed on said InAlAs spacer layer;
a superlattice layer formed by periods of one two-molecules-thick InAs layer and one three-molecules-thick AlAs layer on said InAlAs carrier supply layer; and
electrodes formed on said superlattice layer;
wherein the ratio of average lattice constant of said superlattice layer to lattice constant of said InP substrate is approximately 0.995 to 1.005.

14. A heterojunction field effect type semiconductor device comprising:
an InP substrate;
an undoped InAlAs buffer layer formed on said InP substrate;
an undoped InGaAs channel layer formed on said InAlAs buffer layer;
an undoped InAlAs spacer layer formed on said InGaAs channel layer;
a doped InAlAs carrier supply layer formed on said InAlAs spacer layer;
a superlattice layer formed by periods of one two-molecules-thick InAs layer and one two-molecules-thick AlAs layer on said InAlAs carrier supply layer; and
electrodes formed on said superlattice layer;
wherein the ratio of average lattice constant of said superlattice layer to lattice constant of said InP substrate is approximately 0.995 to 1.005.

15. A heterojunction field effect type semiconductor device comprising:
an InP substrate
an undoped InAlAs buffer layer formed on said InP substrate;
an undoped InGaAs channel layer formed on said InAlAs buffer layer;
an undoped InAlAs spacer layer formed on said InGaAs channel layer;
a doped InAlAs carrier supply layer formed on said InAlAs spacer layer;
a superlattice layer formed by periods of one two-molecules-thick InAs layer and one three-molecules-thick AlGaAs layer on said InAlAs carrier supply layer; and
electrodes formed on said superlattice layer;
wherein the ratio of average lattice constant of said superlattice layer to lattice constant of said InP substrate is approximately 0.995 to 1.005.

16. A heterojunction field effect type semiconductor device comprising:
an InP substrate;
an undoped InAlAs buffer layer formed on said InP substrate;
an undoped InGaAs channel layer formed on said InAlAs buffer layer;
an undoped InAlAs spacer layer formed on said InGaAs channel layer;
a doped InAlAs carrier supply layer formed on said InAlAs spacer layer;
a superlattice layer formed by periods of one two-molecules-thick InAs layer and one two-molecules-thick AlGaAs layer on said InAlAs carrier supply layer; and
electrodes formed on said superlattice layer;
wherein the ratio of average lattice constant of said superlattice layer to lattice constant of said InP substrate is approximately 0.995 to 1.005.

17. A heterojunction field effect type semiconductor device comprising:
an InP substrate;
an undoped InAlAs buffer layer formed on said InP substrate;
an undoped InGaAs channel layer formed on said InAlAs buffer layer;
an undoped InAlAs spacer layer formed on said InGaAs channel layer;
a doped InAlAs carrier supply layer formed on said InAlAs spacer layer;
a first InAlAs Schottky layer formed on said InAlAs carrier supply layer;
a superlattice layer formed by periods of one two-molecules-thick InAs layer and one four-molecules-thick AlAs layer on said first InAlAs Schottky layer;
s second InAlAs Schottky layer formed on said supperlattice layer; and
electrodes formed on said second InAlAs Schottky layer.

18. A heterojunction field effect type semiconductor device comprising:

an InP substrate;

an undoped InAlAs buffer layer formed on said InP substrate;

an undoped InGaAs channel layer formed on said InAlAs buffer layer;

an undoped InAlAs spacer layer formed on said InGaAs channel layer;

a doped InAlAs carrier supply layer formed on said InAlAs spacer layer;

a first InAlAs Schottky layer formed on said InAlAs carrier supply layer;

a superlattice layer formed by periods of one two-molecules-thick InAs layer and one two-molecules-thick AlAs layer on said first InAlAs Schottky layer;

s second InAlAs Schottky layer formed on said supperlattice layer; and electrodes formed on said second InAlAs Schottky layer.

19. A heterojunction field effect type semiconductor device comprising:

an InP substrate;

an undoped InAlAs buffer layer formed on said InP substrate;

an undoped InGaAs channel layer formed on said InAlAs buffer layer;

an undoped InAlAs spacer layer formed on said InGaAs channel layer;

a doped InAlAs carrier supply layer formed on said InAlAs spacer layer;

a first InAlAs Schottky layer formed on said InAlAs carrier supply layer;

a superlattice layer formed by periods of one two-molecules-thick InGaAs layer and one four-molecules-thick AlAs layer on said first InAlAs Schottky layer;

s second InAlAs Schottky layer formed on said supperlattice layer; and electrodes formed on said second InAlAs Schottky layer.

20. A heterojunction field effect type semiconductor device comprising:

an InP substrate;

an undoped InAlAs buffer layer formed on said InP substrate;

an undoped InGaAs channel layer formed on said InAlAs buffer layer;

an undoped InAlAs spacer layer formed on said InGaAs channel layer;

a doped InAlAs carrier supply layer formed on said InAlAs spacer layer;

a first InAlAs Schottky layer formed on said InAlAs carrier supply layer;

a superlattice layer formed by periods of one two-molecules-thick InAs layer and one two-molecules-thick AlGaAs layer on said first InAlAs Schottky layer;

s second InAlAs Schottky layer formed on said supperlattice layer; and electrodes formed on said second InAlAs Schottky layer.

21. A heterojunction field effect type semiconductor device comprising:

an InP substrate;

an undoped InAlAs buffer layer formed on said InP substrate;

an undoped InGaAs channel layer formed on said InAlAs buffer layer;

an undoped InAlAs spacer layer formed on said InGaAs channel layer;

a doped InAlAs carrier supply layer formed on said InAlAs spacer layer;

a superlattice layer formed by periods of one two-molecules-thick InAs layer and one three-molecules-thick AlAs layer on said InAlAs carrier supply layer; and electrodes formed on said superlattice layer;

wherein each of said InAs and said AlAs layers of said superlattice layer is thinner than approximately 4 nm.

22. A heterojunction field effect type semiconductor device comprising:

an InP substrate;

an undoped InAlAs buffer layer formed on said InP substrate;

an undoped InGaAs channel layer formed on said InAlAs buffer layer;

an undoped InAlAs spacer layer formed on said InGaAs channel layer;

a doped InAlAs carrier supply layer formed on said InAlAs spacer layer;

a superlattice layer formed by periods of one two-molecules-thick InAs layer and one two-molecules-thick AlAs layer on said InAlAs carrier supply layer; and electrodes formed on said superlattice layer;

wherein each of said InAs and said AlAs layers of said superlattice layer is thinner than approximately 4 nm.

23. A heterojunction field effect type semiconductor device comprising:

an InP substrate;

an undoped InAlAs buffer layer formed on said InP substrate;

an undoped InGaAs channel layer formed on said InAlAs buffer layer;

an undoped InAlAs spacer layer formed on said InGaAs channel layer;

a doped InAlAs carrier supply layer formed on said InAlAs spacer layer;

a superlattice layer formed by periods of one two-molecules-thick InAs layer and one three-molecules-thick AlGaAs layer on said InAlAs carrier supply layer; and electrodes formed on said superlattice layer;

wherein each of said InAs and said AlGaAs layers of said superlattice layer is thinner than approximately 4 nm.

24. A heterojunction field effect type semiconductor device comprising:

an InP substrate;

an undoped InAlAs buffer layer formed on said InP substrate;

an undoped InGaAs channel layer formed on said InAlAs buffer layer;

an undoped InAlAs spacer layer formed on said InGaAs channel layer;

a doped InAlAs carrier supply layer formed on said InAlAs spacer layer;

a superlattice layer formed by periods of one two-molecules-thick InAs layer and one two-molecules-thick AlGaAs layer on said InAlAs carrier supply layer; and electrodes formed on said superlattice layer;

wherein each of said InAs and said AlGaAs layers of said superlattice layer is thinner than approximately 4 nm.

25. A heterojunction field effect type semiconductor device comprising:

an InP substrate;

an undoped InAlAs buffer layer formed on said InP substrate;

an undoped InGaAs channel layer formed on said InAlAs buffer layer;

an undoped InAlAs spacer layer formed on said InGaAs channel layer;

a doped InAlAs carrier supply layer formed on said InAlAs spacer layer;

a superlattice layer formed by periods of one two-molecules-thick InAs layer and one three-molecules-thick AlAs layer on said InAlAs carrier supply layer; and electrodes formed on said superlattice layer;

wherein the thickness ratio of said InAs and said AlAs layers of said superlattice layer is approximately 0.5 to 2, and said superlattice layer is thinner than approximately 25 nm.

26. A heterojunction field effect type semiconductor device comprising:

an InP substrate;

an undoped InAlAs buffer layer formed on said InP substrate;

an undoped InGaAs channel layer formed on said InAlAs buffer layer;

an undoped InAlAs spacer layer formed on said InGaAs channel layer;

a doped InAlAs carrier supply layer formed on said InAlAs spacer;

a superlattice layer formed by periods of one two-molecules-thick InAs layer and one two-molecules thick AlAs layer on said InAlAs carrier supply; and electrodes formed on said superlattice layer;

wherein the thickness ratio of said InAs and said AlAs layers of said superlattice layer is approximately 0.5 to 2, and said superlattice layer is thinner than approximately 25 nm.

27. A heterojunction field effect type semiconductor device comprising:

an InP substrate;

an undoped InAlAs buffer layer formed on said InP substrate;

an undoped InGaAs channel layer formed on said InAlAs buffer layer;

an undoped InAlAs spacer layer formed on said InGaAs channel layer;

a doped InAlAs carrier supply layer formed on said InAlAs spacer layer;

a superlattice layer formed by periods of one two-molecules-thick InAs layer and one three-molecules-thick AlGaAs layer on said InAlAs carrier supply layer; and electrodes formed on said superlattice layer;

wherein the thickness ratio of said InAs and said AlGaAs layers of said superlattice layer is approximately 0.5 to 2, and said superlattice layer is thinner than approximately 25 nm.

28. A heterojunction field effect type semiconductor device comprising:

an InP substrate;

an undoped InAlAs buffer layer formed on said InP substrate;

an undoped InGaAs channel layer formed on said InAlAs buffer layer;

an undoped InAlAs spacer layer formed on said InGaAs channel layer;

a doped InAlAs carrier supply layer formed on said InAlAs spacer layer;

a superlattice layer formed by periods of one two-molecules-thick InAs layer and one two-molecules-thick AlGaAs layer on said InAlAs carrier supply layer; and electrodes formed on said superlattice layer;

wherein the superlattice ratio of said InAs and said AlGaAs layers of said superlattice layer is approximately 0.5 to 2, and said superlattice layer is thinner than approximately 25 nm.

* * * * *